United States Patent
Zhu et al.

(10) Patent No.: US 11,863,218 B2
(45) Date of Patent: Jan. 2, 2024

(54) GAIN CONTROL METHOD AND APPARATUS

(71) Applicant: SUNWAVE COMMUNICATIONS CO., LTD., Hangzhou (CN)

(72) Inventors: Lumin Zhu, Hangzhou (CN); Hangdi Hong, Hangzhou (CN)

(73) Assignee: SUNWAVE COMMUNICATIONS CO., LTD., Hangzhou (CN)

( * ) Notice: Subject to any disclaimer, the term of this patent is extended or adjusted under 35 U.S.C. 154(b) by 52 days.

(21) Appl. No.: 17/603,944

(22) PCT Filed: Aug. 3, 2020

(86) PCT No.: PCT/CN2020/106627
§ 371 (c)(1),
(2) Date: Oct. 14, 2021

(87) PCT Pub. No.: WO2021/027609
PCT Pub. Date: Feb. 18, 2021

(65) Prior Publication Data
US 2022/0216887 A1    Jul. 7, 2022

(30) Foreign Application Priority Data
Aug. 9, 2019   (CN) .......................... 201910734029.5

(51) Int. Cl.
*H04B 1/04*   (2006.01)
*H04B 10/29*  (2013.01)
(Continued)

(52) U.S. Cl.
CPC ............. *H04B 1/0458* (2013.01); *H03G 3/20* (2013.01); *H04B 1/1607* (2013.01);
(Continued)

(58) Field of Classification Search
CPC .... H04B 1/02; H04B 1/04; H04B 2001/0408; H04B 2001/0416; H04B 1/0458;
(Continued)

(56) References Cited

U.S. PATENT DOCUMENTS 6,240,283 B1    5/2001  Holcombe
8,780,768 B2 *  7/2014  Challa ................. H03G 3/3078
                                                   370/294
(Continued)

FOREIGN PATENT DOCUMENTS

CN    101808392 A    8/2010
CN    102421176 A    4/2012
(Continued)

OTHER PUBLICATIONS

International Search Report of PCT/CN2020/106627.
(Continued)

*Primary Examiner* — Quochien B Vuong

(57) ABSTRACT

The present application relates to a gain control method and an apparatus, comprising an automatic gain controller. An input power of a PSS in an input signal is detected in real time, a rated power of a downlink PSS that acts as a gain control threshold of the automatic gain controller is acquired, and the automatic gain controller is controlled to adjust a value of gain attenuation according to magnitudes of the input power of the PSS and the rated power of the downlink PSS, which is used to adjust an uplink gain and a downlink gain.

10 Claims, 2 Drawing Sheets

(51) Int. Cl.
*H03G 3/20* (2006.01)
*H04B 1/16* (2006.01)
*H04W 52/08* (2009.01)
*H04B 10/2575* (2013.01)
*H04B 10/293* (2013.01)

(52) U.S. Cl.
CPC ......... *H04W 52/08* (2013.01); *H04B 10/2575* (2013.01); *H04B 10/2931* (2013.01); *H04B 2001/0416* (2013.01)

(58) Field of Classification Search
CPC ... H04B 1/06; H04B 1/10; H04B 1/38; H04B 1/40; H04B 1/59; H04B 1/7073; H04B 1/7083
See application file for complete search history.

(56) References Cited

U.S. PATENT DOCUMENTS

| | | | |
|---|---|---|---|
| 8,830,859 B2* | 9/2014 | Weng | .................... H04W 52/52 370/338 |
| 9,100,941 B2* | 8/2015 | Ratasuk | ................ H04W 76/14 |
| 10,299,228 B1 | 5/2019 | Wurtenberger et al. | |
| 2013/0301428 A1 | 11/2013 | Weng et al. | |
| 2013/0322269 A1 | 12/2013 | Zhang et al. | |
| 2021/0083759 A1* | 3/2021 | Hanson | .............. H04B 7/15528 |

FOREIGN PATENT DOCUMENTS

| | | |
|---|---|---|
| CN | 107086859 A | 8/2017 |
| CN | 107948110 A | 4/2018 |
| CN | 110474691 A | 11/2019 |
| KR | 20100071199 A | 6/2010 |

OTHER PUBLICATIONS

Examination Report No. 2 of AU2020330180.
The extended European search report of EP20852073.4.
Notice of Reasons for Refusal of CA3137405 dated Sep. 29, 2023.

* cited by examiner

GAIN CONTROL METHOD AND APPARATUS

CROSS-REFERENCE TO RELATED APPLICATIONS

This application is a National Stage application of International Application No. PCT/CN2020/106627 filed on Aug. 3, 2020, which claims all benefits accruing from China Patent Application No. 201910734029.5, filed on Aug. 9, 2019, in the China National Intellectual Property Administration, both of which are hereby incorporated by reference.

TECHNICAL FIELD

The present disclosure generally relates to the technical field of network communication, and in particular, to a gain control method and an apparatus.

BACKGROUND

In recent years, mobile communication business has been rapidly developing, and users of mobile communication are constantly increasing. For example, a digital fiber optic repeater is a repeater that transmits signals through fiber optics. Features of small optical fiber transmission loss, convenient wiring, and remote transmission can be used to solve a problem of receiving a base station signal in such areas as a rural, a tourist area and a road, and a signal coverage problem in large and super large buildings. The digital fiber optic repeater can be used for large high-rise buildings (group), community and other occasions with high requirements.

However, in the present network application, the level of the input signal of the digital fiber optic repeater is greatly affected by a number of users in the present network. Especially in an application peak, the automatic level control function will switch frequently, which is not good for signal processing of the base station. In addition, a gain of downlink and a gain of uplink are independent. If the gain of uplink does not match the gain of downlink, the signal processing of the base station will be affected.

SUMMARY

According to various embodiments of the present disclosure, a gain control method is provided. The gain control method can be applied to a system requiring gain adjustment, and the system requiring gain adjustment includes at least an automatic gain controller, and the method includes:

detecting an input power of a primary synchronization signal ("PSS") in an input signal in real time;

acquiring a rated power of a downlink PSS that acts as a gain control threshold of the automatic gain controller; and controlling the automatic gain controller to adjust a value of gain attenuation according to magnitudes of the input power of the PSS and the rated power of the downlink PSS, which is used to adjust an uplink gain and a downlink gain.

In an embodiment of the present disclosure, the controlling the automatic gain controller to adjust a value of gain attenuation according to magnitudes of the input power of the PSS and the rated power of the downlink PSS includes:

when the input power of the PSS is greater than the rated power of the downlink PSS, controlling the automatic gain controller to increase the value of gain attenuation until an adjusted input power of the PSS is detected to be less than the rated power of the downlink PSS; and when the input power of the PSS is less than or equal to the rated power of the downlink PSS, controlling the automatic gain controller to adjust the value of gain attenuation, according to a difference between the rated power of the downlink PSS and the input power of the PSS during a preset time.

In an embodiment of the present disclosure, the controlling the automatic gain controller to adjust the value of gain attenuation, according to a difference between the rated power of the downlink PSS and the input power of the PSS during a preset time includes:

acquiring a power difference between the rated power of the downlink PSS and the input power of the PSS during the preset time; and when the power difference during the preset time is greater than a power threshold, controlling the automatic gain controller to reduce the value of gain attenuation.

In an embodiment of the present disclosure, the controlling the automatic gain controller to reduce the value of gain attenuation includes:

detecting the value of gain attenuation while controlling the automatic gain controller to reduce the value of gain attenuation; and when the value of gain attenuation is detected to be greater than zero, continuing to reduce the value of gain attenuation until the adjusted input power of the PSS is greater than the rated power of the downlink PSS.

In an embodiment of the present disclosure, after the detecting the value of gain attenuation, the method further includes: when the value of gain attenuation is detected to be equal to zero, stopping adjusting the value of gain attenuation.

In an embodiment of the present disclosure, the method further includes: when the power difference during the preset time is always less than the power threshold, controlling the automatic gain controller to maintain the current value of gain attenuation.

In an embodiment of the present disclosure, the acquiring a rated power of the downlink PSS that acts as a gain control threshold of an automatic gain controller includes: calculating the rated power of the downlink PSS according to estimated communication parameters of a base station using a formula:

Rated power of the downlink *PSS*=Input power of the downlink *PSS*/Maximum baseband power*Rated power of *a* downlink input, wherein the maximum baseband power is a maximum power during a preset period.

In an embodiment of the present disclosure, the acquiring a rated power of the downlink PSS that acts as a gain control threshold of the automatic gain controller includes: calculating the rated power of the downlink PSS according to set communication parameters of a base station using a formula:

Rated power of the downlink *PSS*=Rated power of the downlink input−Distributed power ratio of *LTE* carrier in which the *PSS* is −10*lg (total subcarriers of the *LTE* carrier in which the *PSS* is /62).

According to various embodiments of the present disclosure, a gain control apparatus is further provided. The gain control apparatus can be applied to a system requiring gain adjustment, and the system requiring gain adjustment includes at least an automatic gain controller. The gain control apparatus includes: a detecting module, configured for detecting an input power of a PSS in an input signal in real time; an acquiring module, configured for acquiring a rated power of a downlink PSS that acts as a gain control threshold of the automatic gain controller; and a controlling module, configured for controlling the automatic gain controller to adjust a value of gain attenuation according to magnitudes of the input power of the PSS and the rated power of the downlink PSS, which is used to adjust an uplink gain and a downlink gain.

In an embodiment of the present disclosure, the controlling module is further configured for controlling the automatic gain controller to increase the value of gain attenuation until an adjusted input power of the PSS is detected to be less than the rated power of the downlink PSS, when the input power of the PSS is greater than the rated power of the downlink PSS; and controlling the automatic gain controller to adjust the value of gain attenuation, according to a difference between the rated power of the downlink PSS and the input power of the PSS during a preset time, when the input power of the PSS is less than or equal to the rated power of the downlink PSS.

BRIEF DESCRIPTION OF THE DRAWINGS

To describe and illustrate embodiments and/or examples of the present disclosure made public here better, reference may be made to one or more of the figures. The additional details or examples used to describe the figures should not be construed as limiting the scope of any of the present disclosure, the embodiments and/or examples currently described, and the best model of the present disclosure as currently understood.

DETAILED DESCRIPTION OF THE EMBODIMENTS

In order to make the above purposes, technical solutions and advantages of the present disclosure more obvious and clear, the present disclosure is clearly and completely described in the following with reference to the accompanying drawings and embodiments of the present disclosure. It should be understood that the embodiments described herein are intended only to explain the present disclosure and not to define the present disclosure.

Figure 1:
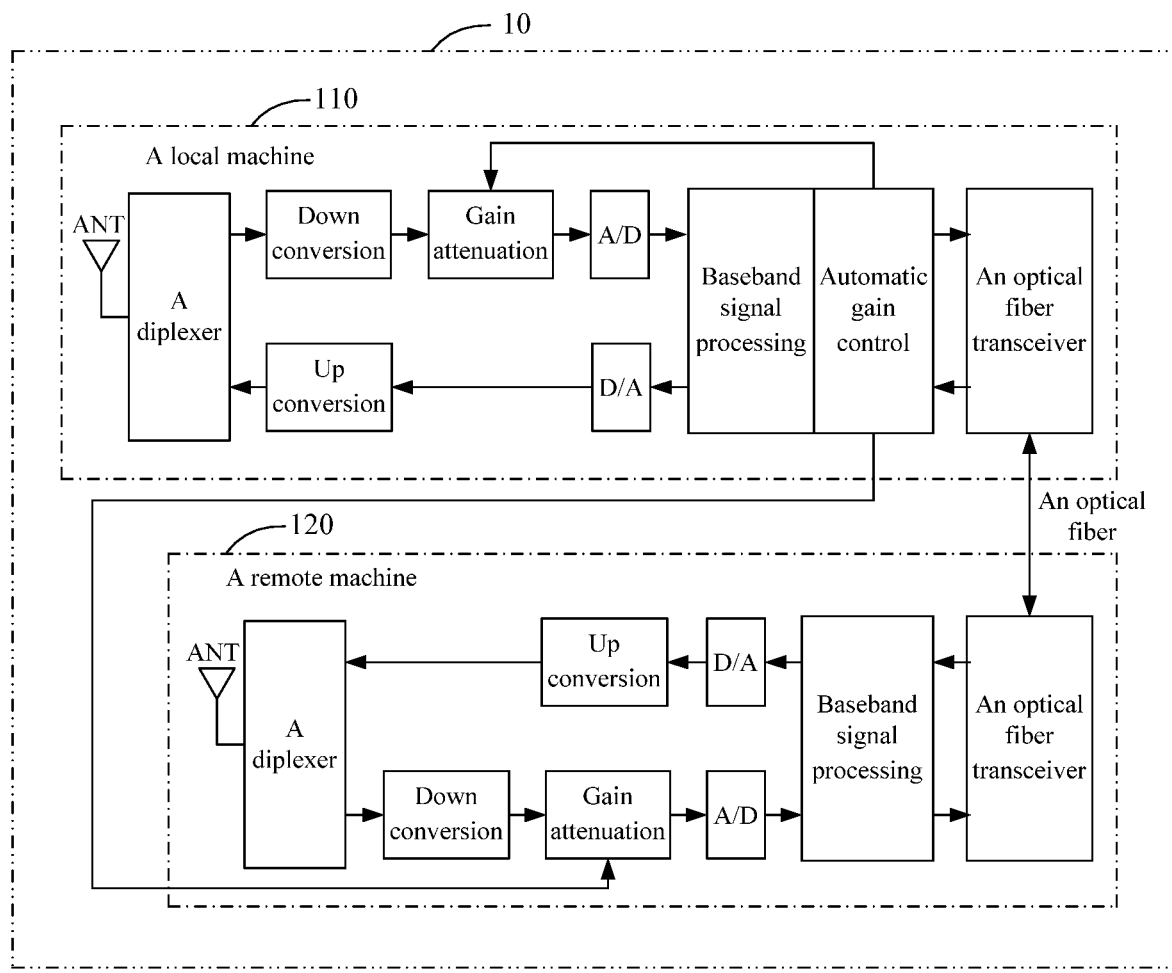
FIG. 1 is a schematic diagram of an application environment of a gain control method in an embodiment of the present disclosure.

FIG. 1 is a schematic diagram of an application environment of a gain control method in an embodiment. As shown in the FIG. 1, the application environment includes, but is not limited to, a system requiring gain adjustment, such as a repeater or a distributed antenna system ("DAS"). The following takes a digital fiber retractor as an example. A digital fiber retractor 10 includes a local machine 110 and remote machines 120. Multiple remote machines 120 can be cascaded to one local machine 110. A transmission principle of downlink of the digital fiber repeater 10 is as follows: a downlink signal can be coupled from a base station to the local machine 110 through a coupler. The local machine 110 receives the downlink signal by an antenna, and converts the downlink signal into an intermediate frequency signal through down conversion. The intermediate frequency signal is sent to an analog-to-digital converter ("AD") after an adjustment thereto made by an attenuation module using an attenuation value from an automatic gain controller. After the gain adjustment, the intermediate frequency signal can be sampled by the AD and converted into a digital signal. The digital signal is processed by a baseband signal processing, packaged to an optical fiber transceiver, and transmitted to the remote machine 120 through an optical fiber. The remote machine 120 can receive the digital signal of the local machine 110 through the optical fiber transceiver. After the baseband signal processing, the digital signal can be converted into an analog signal through a digital-to-analog converter ("DA"). The analog signal can be sent out through an antenna after up-conversion and power amplifier processing. A transmission principle of the uplink corresponds to that of the downlink, and is not described here.

In an embodiment of the present disclosure, the system requiring gain adjustment can detect an input power of a primary synchronization signal ("PSS") in an input signal in real time, acquire a rated power of a downlink PSS that acts as a gain control threshold of the automatic gain controller, and control the automatic gain controller to adjust a value of gain attenuation according to magnitudes of the input power of the PSS and the rated power of the downlink PSS, which is used to adjust an uplink gain and a downlink gain. The solution provided in the present disclosure can control levels of the input signal based on the magnitude relationship between the input power of the PSS and the rated power of the downlink PSS, avoiding frequent switching of automatic level control function during application peak hours, and the downlink gain and the uplink gain are linkage controlled at the same time to prevent interference with the base station due to excessively high uplink noise floor.

Figure 2:
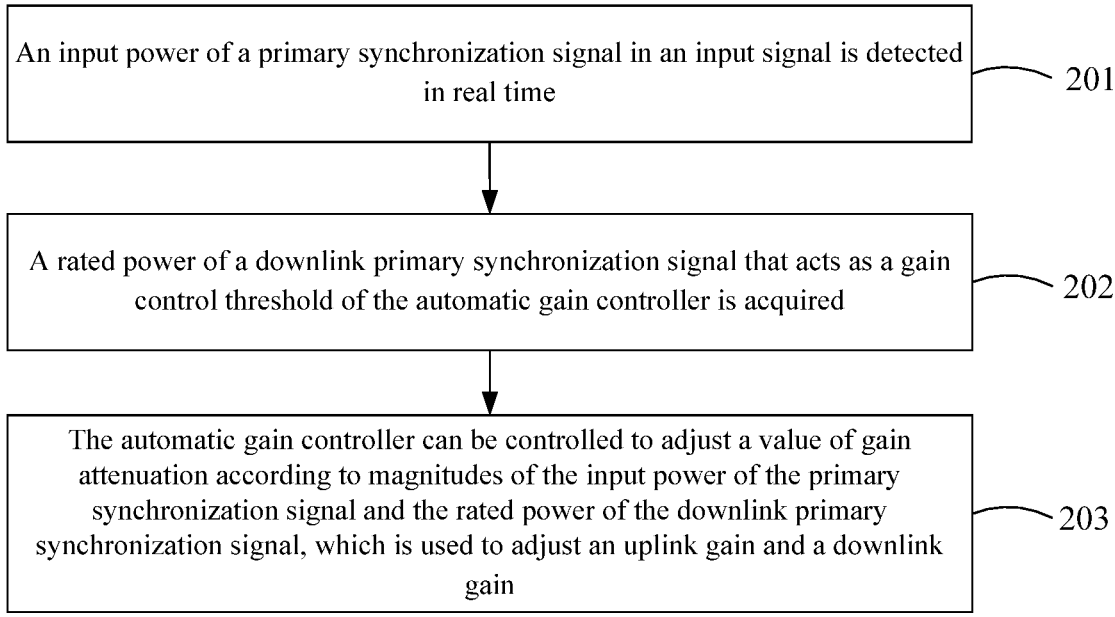
FIG. 2 is a flowchart diagram of a gain control method in an embodiment of the present disclosure.

FIG. 2 is a flowchart diagram of a gain control method in an embodiment of the present disclosure. A gain control method is provided in the present disclosure, and the system requiring gain adjustment includes at least the automatic gain controller. As shown in FIG. 2, the gain control method includes step 201 to step 203.

At step 201, an input power of a PSS in an input signal is detected in real time.

Specifically, in network communication, the input signal of the system requiring gain adjustment includes the PSS. The input power of a real-time PSS can be obtained by detecting the PSS in the input signal in real time. A physical-layer cell identity ("PCI") consists of the PSS and 3*Secondary Synchronization Signal ("SSS"). The PSS consumes 6 RB, i.e. 72 sc of system bandwidth in the frequency domain, and the PSS indicates that IDs in a physical-layer including 0, 1 and 2 (a number of the IDs is three).

At step 202, a rated power of a downlink PSS that acts as a gain control threshold of the automatic gain controller is acquired.

Specifically, the automatic gain controller ("AGC") can use an effective combination of linear amplification and compression amplification to adjust the level of the input signal of the uplink and downlink of the system requiring gain adjustment. The rated power of the downlink PSS of the AGC is compared with the input signal information of the AGC. If the input signal information (power or voltage amplitude) does not match with the rated power of the downlink PSS, an external attenuator is controlled to increase or decrease the value of gain attenuation to adjust the levels of the input signal of the uplink and downlink. The downlink PSS represent the PSS in downlink data. The rated power of the downlink PSS can be calculated according to communication parameters of the base station acquired, and the rated power of the downlink PSS can be used as the rated power of the downlink PSS of the AGC.

At step 203, the automatic gain controller can be controlled to adjust a value of gain attenuation according to magnitudes of the input power of the PSS and the rated power of the downlink PSS, which is used to adjust an uplink gain and a downlink gain.

Specifically, the rated power of the downlink PSS can be calculated according to the communication parameters of the base station, and the rated power of the downlink PSS can be used as the rated power of the downlink PSS of the AGC. The magnitude relationship between the input power of the PSS and the rated power of the downlink PSS is obtained to control the value of gain attenuation. The AGC can control the gains of uplink and downlink of the system requiring gain adjustment by adjusting the value of gain attenuation. The value of gain attenuation can be used to adjust the levels of the input signal of the uplink and downlink by controlling gain devices of the local machine and the remote machine. Specifically, the value of gain attenuation is configured to adjust the level of the input signal of the downlink for gain adjustment. The value of gain attenuation corresponding to the local machine is transmitted to the remote machine synchronously, and the value of gain attenuation can also control the level of the input signal of the uplink of the remote machine, so as to realize the gain adjustment of the uplink, i.e., the value of gain attenuation can enable synchronous linkage control of the downlink gain and the uplink gain in the system.

In the above gain control method, the input power of the PSS in an input signal is detected in real time, the rated power of the downlink PSS that acts as the gain control threshold of the automatic gain controller is acquired, and the automatic gain controller can be controlled to adjust the value of gain attenuation according to magnitudes of the input power of the PSS and the rated power of the downlink PSS, which is used to adjust the uplink gain and the downlink gain. In the present disclosure, the rated power of the downlink PSS can be used as the rated power of the downlink PSS of the AGC, and the magnitude relationship between the input power of the PSS and the rated power of the downlink PSS is detected to control the gain of the input signal of the uplink and downlink, avoiding frequent switching of automatic level control function during application peak hours. The uplink gain and the downlink gain are further controlled. The method can prevent frequent switching of signal levels, and linkage control the downlink gain and the uplink gain at the same time to prevent interference with the base station due to excessively high uplink noise floor.

Figure 3:
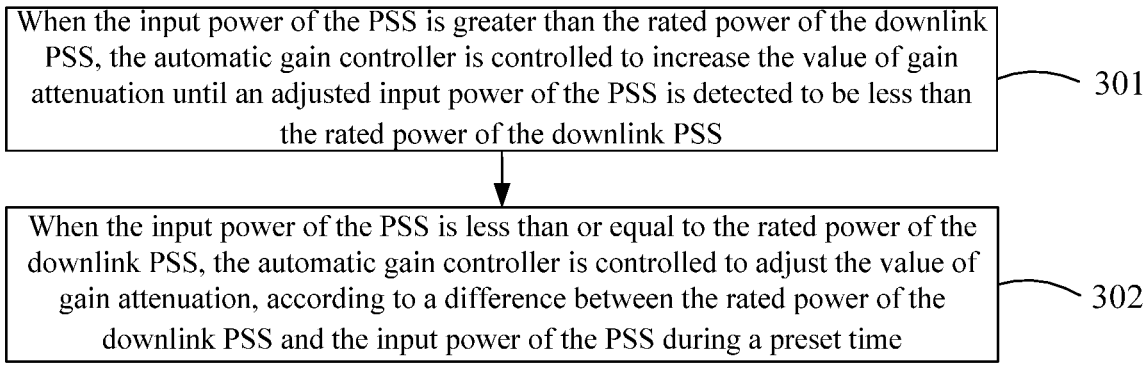
FIG. 3 is a flowchart diagram of controlling an automatic gain controller to adjust a value of gain attenuation according to magnitudes of an input power of a PSS and a rated power of a downlink PSS in an embodiment of the present disclosure.

FIG. 3 is a flowchart diagram of controlling the automatic gain controller to adjust the value of gain attenuation according to magnitudes of the input power of the PSS and rated power of the downlink PSS in an embodiment of the present disclosure. The method includes step 301 to step 302.

At step 301, when the input power of the PSS is greater than the rated power of the downlink PSS, the automatic gain controller is controlled to increase the value of gain attenuation until an adjusted input power of the PSS is detected to be less than the rated power of the downlink PSS.

Specifically, the input power of the PSS and the rated power of the downlink PSS are acquired, and the rated power of the downlink PSS can be used as the gain control threshold of the automatic gain controller. When the input power of the PSS is greater than the rated power of the downlink PSS, the levels of input signals of downlink and uplink is automatically reduced according to the input power of the PSS in real-time detection. The automatic gain controller can increase the value of gain attenuation to ensure that output power of the AGC is kept within an allowable error range of the maximum output power. The value of gain attenuation can be used to adjust the levels of the input signal of the uplink and downlink by controlling gain devices of the local machine and the remote machine. The value of gain attenuation can be accumulated through a counter, and a step of each accumulation can be defined by an engineer according to actual requirements. In the process of adjusting the value of gain attenuation, the adjusted input power of the PSS can be compared with the rated power of the downlink PSS. When the adjusted input power of the PSS is greater than the rated power of the downlink PSS, the value of gain attenuation is increased until the input power of the PSS does not exceed the rated power of the downlink PSS.

At step 302: when the input power of the PSS is less than or equal to the rated power of the downlink PSS, the automatic gain controller is controlled to adjust the value of gain attenuation, according to a difference between the rated power of the downlink PSS and the input power of the PSS during a preset time.

Specifically, the input power of the PSS and the rated power of the downlink PSS are acquired, and the rated power of the downlink PSS can be used as the gain control threshold of the automatic gain controller. When the input power of the PSS is less than the rated power of the downlink PSS, a power difference between the rated power of the downlink PSS and the input power of the PSS is acquired. Since the rated power of the downlink PSS is greater than the input power of the PSS, the power difference is defined as a difference by the rated power of the downlink PSS minus the input power of the PSS. The levels of the downlink input signal and the uplink input signal are increased according to the difference between the input power of the PSS detected during the preset time and the rated power of the downlink PSS, ensuring that the output power of the AGC is within the allowable error range of the maximum output power. The preset time can be 30 minutes, 60 minutes, 120 minutes, etc. The preset time can be set by the engineer according to a control accuracy of the automatic gain controller. The above list is for example only and does not limit the preset time.

Figure 4:
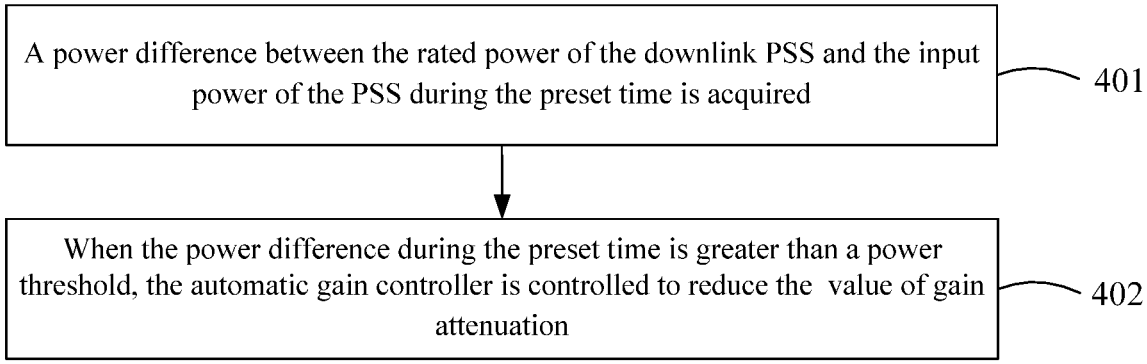
FIG. 4 is a flowchart diagram of controlling an automatic gain controller to adjust the value of gain attenuation according to a difference between the rated power of the downlink PSS and the input power of the PSS during a preset time in an embodiment of the present disclosure.

FIG. 4 is a flowchart diagram of controlling an automatic gain controller to adjust the value of gain attenuation according to a difference between the rated power of the downlink PSS and the input power of the PSS during a preset time in an embodiment of the present disclosure. The method includes step 401 to step 402.

At step 401, a power difference between the rated power of the downlink PSS and the input power of the PSS during the preset time is acquired.

Specifically, the input power of the PSS is detected in real time during the preset time, and the rated power of the downlink PSS can be used as the gain control threshold of the automatic gain controller. The preset time can be set by the engineer according to a signal period of a present network. The input power of the PSS can be detected in real time during the preset time, and a difference between the rated power of the downlink PSS and the input power of the PSS detected in real time during the preset time can be calculated.

At step 402, when the power difference during the preset time is greater than a power threshold, the automatic gain controller is controlled to reduce the value of gain attenuation.

Specifically, the power threshold is configured to set an allowable error range of the input power of the PSS, and the power threshold can be set by the engineer according to actual requirements, such as 2 dB, 3 dB, 5 dB, 7 dB, or 10 dB, etc. It should be noted that the preceding power thresholds are for example only and do not limit the power threshold. During the preset time, when the power difference between the rated power of the downlink PSS and the input power of the PSS detected in real time is greater than the power threshold, it indicates that a currently detected input power of the PSS is not within the allowable error range of the input power of the PSS, i.e., the currently detected input power of the PSS is low, and the automatic gain controller needs to be controlled to reduce the value of gain attenuation, increasing the levels of the input signals of the downlink and uplink and then controlling the uplink gain and downlink gain.

It should be understood that although the steps in the flowchart diagram in FIG. 2 to FIG. 4 are shown in sequence as indicated by arrows, the steps are not necessarily executed in the order indicated by the arrows. Unless explicitly stated in the present disclosure, there is no strict order in which the steps can be performed, and the steps can be performed in any other order. In addition, at least a part of the steps in FIG. 2 to FIG. 4 can include multiple sub-steps or stages. The sub-steps or the stages are not necessarily executed at the same time, but can be executed at different times. An execution sequence of the sub-steps or the stages is not necessarily sequential. The sub-steps or the stages may be performed alternately or in turn with other steps or at least a part of a sub-step or phase of other steps.

In an embodiment of the present disclosure, the automatic gain controller can be controlled to reduce the value of gain attenuation, including the following steps: the value of gain attenuation can be detected while the automatic gain controller is controlled to reduce the value of gain attenuation; and when the value of gain attenuation is detected to be greater than zero, the value of gain attenuation is continuing to be reduced until the adjusted input power of the PSS is greater than the rated power of the downlink PSS.

Specifically, when the power difference corresponding to the preset time is greater than the power threshold, it indicates that the currently detected input power of the PSS is not within the allowable error range of the input power of the PSS, i.e., the currently detected input power of the PSS is low, and the automatic gain controller needs to be controlled to reduce the value of gain attenuation. When the automatic gain controller is reducing the value of gain attenuation, the current value of gain attenuation of the automatic gain controller is repeatedly detected. When the value of gain attenuation of the automatic gain controller is greater than zero, the automatic gain controller is controlled to continue to reduce the value of gain attenuation. The current adjusted input power of the PSS is repeatedly detected until the adjusted input power of the PSS is greater than or equal to the rated power of the downlink PSS, and then the adjustment of the value of gain attenuation is stopped.

In an embodiment of the present disclosure, after the value of gain attenuation is detected, the method further includes: when the value of gain attenuation is detected to be equal to zero, the adjustment of the value of gain attenuation is stopped.

Specifically, when the power difference corresponding to the preset time is greater than the power threshold, it indicates that the currently detected input power of the PSS is not within the allowable error range of the input power of the PSS, i.e., the currently detected input power of the PSS is low, and the automatic gain controller needs to be controlled to reduce the value of gain attenuation. When the automatic gain controller is reducing the value of gain attenuation, the current value of gain attenuation of the automatic gain controller is repeatedly detected. When the value of gain attenuation of the automatic gain controller is greater than zero, the automatic gain controller is controlled to continue to reduce the value of gain attenuation. The adjustment of the value of gain attenuation is stopped until the value of gain attenuation is equal to zero.

In an embodiment of the present disclosure, the method further includes: when the power difference during the preset time is always less than the power threshold, the automatic gain controller is controlled to maintain the current value of gain attenuation.

Specifically, the power threshold is configured to set the allowable error range of the input power of the PSS, and the power threshold can be set by the engineer according to actual requirements, such as 2 dB, 3 dB, 5 dB, 7 dB, or 10 dB, etc. It should be noted that the preceding power thresholds are for example only and do not limit the power threshold. When the power difference between the rated power of the downlink PSS and the input power of the PSS detected in real time during the preset time is always less than the power threshold, it indicates that currently detected input power of the PSS is within the allowable error range of input power of the PSS, and the automatic gain controller is controlled to maintain the current value of gain attenuation.

In an embodiment of the present disclosure, the rated power of the downlink PSS that acts as a gain control threshold of an automatic gain controller is acquired, including the following steps: the rated power of the downlink PSS is calculated according to estimated communication parameters of the base station, and a first calculation formula is defined by the following: Rated power of the downlink PSS=Input power of the downlink PSS/Maximum baseband power*Rated power of a downlink input, wherein the maximum baseband power is maximum power in a preset period.

Specifically, the communication parameters of the base station are estimated automatically, including the input power of downlink PSS, the maximum baseband power and the rated power of downlink input. The maximum baseband power can be the maximum power in the preset period, and the preset period can be adjusted according to the present network. The rated power of the downlink PSS is acquired according to the estimated communication parameters of the base station using a formula:

$$\text{Rated power of the downlink } PSS = \text{Input power of the downlink } PSS/\text{Maximum baseband power} * \text{Rated power of the downlink input.}$$

An acquired rated power of the downlink PSS can be used as the rated power of the downlink PSS of the AGC.

In an embodiment of the present disclosure, the rated power of the downlink PSS that acts as a gain control threshold of an automatic gain controller is acquired, including the following steps: the rated power of the downlink PSS is calculated according to set communication parameters of a base station using a formula:

> Rated power of the downlink *PSS*=Rated power of the downlink input−Distributed power ratio of Long Term Evolution ("*LTE*") carrier in which the *PSS* is −10*\**lg* (total subcarriers of the *LTE* carrier in which the *PSS* is /62).

Specifically, the communication parameters of the base station are set manually, including the distributed power ratio of LTE carrier in which the PSS is and the total subcarriers of the LTE carrier in which the PSS is. The rated power of the downlink PSS is acquired according to manually set communication parameters of the base station using a formula:

> Rated power of the downlink input−Distributed power ratio of the *LTE* carrier in which the *PSS* is −10*\**lg* (total subcarriers of the *LTE* carrier in which the *PSS* is /62).

An acquired rated power of the downlink PSS can be used as the rated power of the downlink PSS of the AGC.

Figure 5:
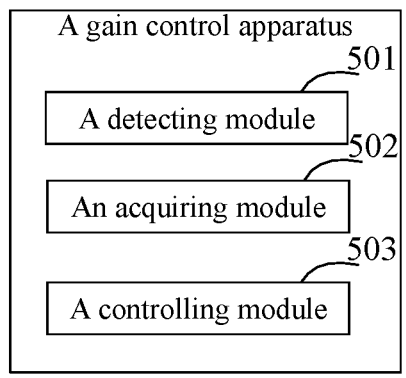
FIG. 5 is a schematic diagram of a gain control apparatus in an embodiment of the present disclosure.

FIG. 5 is a schematic diagram of a gain control apparatus in an embodiment of the present disclosure. The gain control apparatus can be applied to the system requiring gain adjustment, and the system requiring gain adjustment includes at least the automatic gain controller, and the gain control apparatus includes:

a detecting module 501, configured for detecting an input power of a PSS in an input signal in real time, specifically, in network communication, the input signal of the system requiring gain adjustment includes the PSS. The detecting module 501 is configured for obtaining the input power of a real-time PSS by detecting the PSS in the input signal in real time. A physical-layer cell identity ("PCI") consists of the PSS and 3*Secondary Synchronization Signal ("SSS"). The PSS consumes 6 RB, i.e. 72 sc of system bandwidth in the frequency domain, and the PSS indicates that IDs in a physical-layer including 0, 1 and 2 (a number of the IDs is three), an acquiring module 502, configured for acquiring a rated power of a downlink PSS that acts as a gain control threshold of the automatic gain controller, specifically, the automatic gain controller (AGC) can use an effective combination of linear amplification and compression amplification to adjust the gain of the input signal of the system requiring gain adjustment. The rated power of the downlink PSS of the AGC is compared with the input signal information of the AGC. If the input signal information (power or voltage amplitude) does not match the rated power of the downlink PSS, an external attenuator is controlled to increase or decrease the value of gain attenuation to adjust the levels of the input signal of the uplink and downlink. The downlink PSS is defined as the PSS in downlink data. The acquiring module 502 is configured to calculate the rated power of the downlink PSS according to the communication parameters of the base station acquired, and take the rated power of the downlink PSS as the rated power of the downlink PSS of the AGC, a controlling module 503, configured for controlling the automatic gain controller to adjust a value of gain attenuation according to magnitudes of the input power of the PSS and the rated power of the downlink PSS, which is used to adjust an uplink gain and a downlink gain, specifically, the controlling module 503 is configured to calculate the rated power of the downlink PSS according to the communication parameters of the base station acquired, and take the rated power of the downlink PSS as the rated power of the downlink PSS of the AGC. A magnitude relationship of between the input power of the PSS and the rated power of the downlink PSS is obtained to control the value of gain attenuation. The AGC can control the gain of the uplink and downlink of the system requiring gain adjustment by adjusting the value of gain attenuation. The value of gain attenuation can be used to adjust the levels of the input signal of the uplink and downlink by controlling gain devices of the local machine and the remote machine. Specifically, the value of gain attenuation is configured to adjust the level of the input signal of the downlink for gain adjustment. The value of gain attenuation corresponding to the local machine is transmitted to the remote machine synchronously, and the value of gain attenuation can also control the level of the input signal of the uplink of the remote machine, so as to realize the gain adjustment of the uplink, i.e., the value of gain attenuation can enable synchronous linkage control of the downlink gain and the uplink gain in the system.

In an embodiment of the present disclosure, the controlling module 503 is further configured to control the automatic gain controller to increase the value of gain attenuation until the adjusted input power of the PSS is detected to be less than the rated power of the downlink PSS when the input power of the PSS is greater than the rated power of the downlink PSS, acquire a power difference between the rated power of the downlink PSS and the input power of the PSS during the preset time, and control the automatic gain controller to reduce the value of gain attenuation when the power difference during the preset time is greater than a power threshold.

Specifically, the input power of the PSS and the rated power of the downlink PSS are acquired, and the rated power of the downlink PSS can be used as the gain control threshold of the automatic gain controller. When the input power of the PSS is greater than the rated power of the downlink PSS, the levels of the input signals of the downlink and uplink is automatically reduced according to the input power of the PSS in real-time detection. The automatic gain controller can increase the value of gain attenuation to ensure that output power of the AGC is kept within the allowable error range of the maximum output power. The value of gain attenuation can be used to adjust the levels of the input signal of the uplink and downlink by controlling gain devices of the local machine and the remote machine. The value of gain attenuation can be accumulated through the counter, and the step of each accumulation can be defined by the engineer according to actual requirements. In the process of adjusting the value of gain attenuation, the adjusted input power of the PSS can be compared with the rated power of the downlink PSS. When the adjusted input power of the PSS is greater than the rated power of the downlink PSS, the value of gain attenuation is increased until the input power of the PSS does not exceed the rated power of the downlink PSS. When the adjusted input power of the PSS is less than or equal to the rated power of the downlink PSS, the input power of the PSS can be detected in real time during the preset time, and the difference between the rated power of the downlink PSS and the input power of the PSS detected in real time during the preset time can be calculated. During the preset time, when the power difference between the rated power of the downlink PSS and the input power of the PSS detected in real time is greater than the power threshold, it indicates that the currently detected input power of the PSS is not within the allowable error range of the input power of the PSS, i.e., the currently detected input power of the PSS is low, and the automatic gain controller needs to be controlled to reduce the value of gain attenuation, increasing the levels of the input signals of the downlink and uplink and then increasing the uplink gain and downlink gain.

The above gain control apparatus can be applied to the system requiring gain adjustment, and the system requiring gain adjustment includes at least the automatic gain controller. The gain control apparatus includes: the detecting module, configured for detecting the input power of the PSS in the input signal in real time; the acquiring module, configured for acquiring the rated power of the downlink PSS that acts as the gain control threshold of the automatic gain controller; and the controlling module, configured for controlling the automatic gain controller to adjust a value of gain attenuation according to magnitudes of the input power of the PSS and the rated power of the downlink PSS, which is used to adjust an uplink gain and a downlink gain. In the present disclosure, the rated power of the downlink PSS is used as the gain control threshold of the automatic gain controller, the magnitude relationship between the input power of the PSS and the rated power of the downlink PSS is detected to control the levels of the input signal of the uplink and downlink, and the uplink gain and the downlink gain are further controlled. The apparatus can prevent frequent switching of signal levels, and linkage control the downlink gain and the uplink gain at the same time to prevent interference with a base station due to excessively high uplink noise floor.

The technical features of the above-described embodiments may be combined in any combination. For the sake of brevity of description, not all possible combinations of the technical features in the above embodiments are described. However, as long as there is no contradiction between the combinations of these technical features, all should be considered as within the scope of this disclosure.

The above-described embodiments are merely illustrative of several embodiments of the present disclosure, and the description thereof is relatively specific and detailed, but is not to be construed as limiting the scope of the disclosure. It should be noted that a plurality of variations and modifications may be made by those skilled in the art without departing from the spirit and scope of the disclosure. Therefore, the scope of the disclosure should be determined by the appended claims.

We claim:

1. A gain control method, wherein the method comprises:
   detecting an input power of a primary synchronization signal ("PSS") in an input signal in real time;
   acquiring a rated power of a downlink PSS that acts as a gain control threshold of an automatic gain controller; and
   controlling the automatic gain controller to adjust a value of gain attenuation according to magnitudes of the input power of the PSS and the rated power of the downlink PSS, which is used to adjust an uplink gain and a downlink gain; wherein the value of gain attenuation is used to adjust levels of the input signal of the uplink and downlink by controlling gain devices of a local machine and a remote machine, the value of gain attenuation is configured to adjust the level of the input signal of the downlink for gain adjustment, the value of gain attenuation corresponding to the local machine is transmitted to the remote machine synchronously, and the value of gain attenuation is also configured to control the level of the input signal of the uplink of the remote machine.

2. The gain control method of claim 1, wherein the controlling the automatic gain controller to adjust a value of gain attenuation according to magnitudes of the input power of the PSS and the rated power of the downlink PSS comprises:
   when the input power of the PSS is greater than the rated power of the downlink PSS, controlling the automatic gain controller to increase the value of gain attenuation until an adjusted input power of the PSS is detected to be less than the rated power of the downlink PSS; and
   when the input power of the PSS is less than or equal to the rated power of the downlink PSS, controlling the automatic gain controller to adjust the value of gain attenuation, according to a difference between the rated power of the downlink PSS and the input power of the PSS during a preset time.

3. The gain control method of claim 2, wherein the controlling the automatic gain controller to adjust the value of gain attenuation, according to a difference between the rated power of the downlink PSS and the input power of the PSS during a preset time comprises:
   acquiring a power difference between the rated power of the downlink PSS and the input power of the PSS during the preset time; and
   when the power difference during the preset time is greater than a power threshold, controlling the automatic gain controller to reduce the value of gain attenuation.

4. The gain control method of claim 3, wherein the controlling the automatic gain controller to reduce the value of gain attenuation comprises:
   detecting the value of gain attenuation while controlling the automatic gain controller to reduce the value of gain attenuation; and
   when the value of gain attenuation is detected to be greater than zero, continuing to reduce the value of gain attenuation until the adjusted input power of the PSS is greater than the rated power of the downlink PSS.

5. The gain control method of claim 4, wherein after the detecting the value of gain attenuation, the method further comprises:
   when the value of gain attenuation is detected to be equal to zero, stopping adjusting the value of gain attenuation.

6. The gain control method of claim 3, wherein the method further comprises:
   when the power difference during the preset time is always less than the power threshold, controlling the automatic gain controller to maintain the current value of gain attenuation.

7. The gain control method of claim 1, wherein the acquiring a rated power of a downlink PSS that acts as a gain control threshold of an automatic gain controller comprises:
   calculating the rated power of the downlink PSS according to estimated communication parameters of a base station using a formula:

Rated power of the downlink $PSS$=Input power of the downlink $PSS$/Maximum baseband power*Rated power of the downlink input signal, wherein the maximum baseband power is a maximum power during a preset period.

8. The gain control method of claim 1, wherein the acquiring a rated power of the downlink PSS that acts as a gain control threshold of the automatic gain controller comprises:

calculating the rated power of the downlink PSS according to set communication parameters of a base station using a formula:

Rated power of the downlink $PSS$=Rated power of the downlink input−Distributed power ratio of $LTE$ carrier in which the $PSS$ is −10*$lg$ (total subcarriers of the $LTE$ carrier in which the $PSS$ is /62).

9. A gain control apparatus applied to a system requiring gain adjustment, the system requiring gain adjustment comprising at least an automatic gain controller, wherein the automatic gain controller is configured for detecting an input power of a primary synchronization signal ("PSS") in an input signal in real time;

acquiring a rated power of a downlink PSS that acts as a gain control threshold of an automatic gain controller; and controlling the automatic gain controller to adjust a value of gain attenuation according to magnitudes of the input power of the PSS and the rated power of the downlink PSS, which is used to adjust an uplink gain and a downlink gain; wherein the value of gain attenuation is used to adjust levels of the input signal of the uplink and downlink by controlling gain devices of a local machine and a remote machine, the value of gain attenuation is configured to adjust the level of the input signal of the downlink for gain adjustment, the value of gain attenuation corresponding to the local machine is transmitted to the remote machine synchronously, and the value of gain attenuation is also configured to control the level of the input signal of the uplink of the remote machine.

10. The gain control apparatus of claim 9, wherein the automatic gain controller is further configured for controlling the automatic gain controller to increase the value of gain attenuation until an adjusted input power of the PSS is detected to be less than the rated power of the downlink PSS, when the input power of the PSS is greater than the rated power of the downlink PSS; and controlling the automatic gain controller to adjust the value of gain attenuation, according to a difference between the rated power of the downlink PSS and the input power of the PSS during a preset time, when the input power of the PSS is less than or equal to the rated power of the downlink PSS.

* * * * *